United States Patent [19]
Diba et al.

[11] Patent Number: 5,610,536
[45] Date of Patent: Mar. 11, 1997

[54] MACROCELL ARCHITECTURE WITH HIGH SPEED PRODUCT TERMS

[75] Inventors: Sholeh Diba, Los Gatos; Wei-Yi Ku, San Jose, both of Calif.

[73] Assignee: Xilinx, Inc., San Jose, Calif.

[21] Appl. No.: 533,889

[22] Filed: Sep. 26, 1995

[51] Int. Cl.$^6$ .................................................. H03K 17/00
[52] U.S. Cl. .................................................. 326/40
[58] Field of Search ........................................ 326/39, 40

[56] References Cited

U.S. PATENT DOCUMENTS

| | | | |
|---|---|---|---|
| 4,758,746 | 7/1988 | Birkner et al. | 326/40 |
| 5,121,006 | 6/1992 | Pedersen | 326/40 |
| 5,309,046 | 5/1994 | Steele | 326/40 |
| 5,350,954 | 9/1994 | Patel | 326/39 |
| 5,362,999 | 11/1994 | Chiang | 326/44 |

OTHER PUBLICATIONS

"The Programmable Logic Data Book" copyright 1994, available from Xilinx, Inc., 2100 Logic Drive, San Jose, CA 95124.

Primary Examiner—David R. Hudspeth
Assistant Examiner—Richard Roseen
Attorney, Agent, or Firm—Norman R. Klivans; Jeanette S. Harms

[57] ABSTRACT

A programmable logic array, where the programmable AND gate array in each block of macrocells conventionally generates a number of product terms to drive the macrocells in that block. Five product terms are assigned to each macrocell and are logically NORed together with two adjacent macrocell signals. The resultant signal drives the D terminal of the flip-flop in the macrocell. Independently, all five product terms are logically NORed together and the resultant signal is provided as an export signal to an adjacent macrocell for an additional product term use. Thirdly, each one of the product terms can be individually set as a separate private product term for use internally in that macrocell to replace the otherwise global provisions of internal macrocell signals such as set, reset, clock, output enable and inversion.

8 Claims, 5 Drawing Sheets

5,610,536

MACROCELL ARCHITECTURE WITH HIGH SPEED PRODUCT TERMS

BACKGROUND OF THE INVENTION

1. Field of the Invention

This invention relates to programmable logic arrays and specifically to a particular macrocell architecture for a programmable logic array.

2. Description of the Related Art

Programmable logic arrays, for instance programmable logic devices (PLDs), typically include a plurality of function blocks interconnected by an interconnect matrix. Each function block includes a programmable array of AND gates as well as a plurality of macrocells which receive product terms from the programmable array. The macrocells are essentially identical prior to programming. An illustrative function block includes 18 macrocells receiving 90 product terms from the programmable array, i.e. five product terms per macrocell.

FIG. 1A shows a generic AND array 10 driving a set of sense amplifiers 14 which in turn provides five product terms 1–5 for a macrocell 16. Note that only a portion of macrocell 16 is shown; each macrocell also includes a flip-flop, output buffer, and other elements which are not shown but are well known to those in the art. See e.g. *The Programmable Gate Array Data Book*, pp. 3–5 to 3–12, Xilinx, 1994, incorporated by reference herein. In one embodiment, product terms 1–5 are inverted by inverters I1–I5, respectively.

Product terms 1–4 of the macrocell are provided to a conventional NOR gate 20 (shown at the transistor level including transistors Q1–Q4 and Q6), wherein the output signal of NOR gate 20 is provided to the D input terminal of the macrocell flip-flop (not shown) via line D. The product term on line 5 drives the asynchronous active-high programmable reset (or set) input signal to the macrocell flip-flop. Thus, of the five product terms in the prior art, only one product term, i.e. product term 5, sets or resets the flip-flop. A gate level version of NOR gate 20 is shown in FIG. 1B. Therefore, only four product terms are used for the logic function of driving the D (data) input to the macrocell flip-flop. A more flexible structure in terms of use of the product terms would be desirable, but is not available in the prior art.

SUMMARY OF THE INVENTION

In accordance with the invention, five product terms are provided programmably as input signals to a first NOR gate which drives the D input terminal of the macrocell flip-flop. The same five product terms are programmably provided as input signals to a second NOR gate, the output signal of which is selectively exported to the NOR gate of two adjacent macrocells. Additionally, the five product terms are programably provided as private (internal) product terms to that particular macrocell for purposes of being input signals to the D-type flip-flop, serving for instance as reset, set, clock, output enable, and inversion signals. Advantageously, the present invention significantly increases the flexibility of use of the product terms in comparison to prior art circuits, and therefore is uniquely suited for very complex, high performance integrated circuits.

BRIEF DESCRIPTION OF THE DRAWINGS

Identical reference numbers in various figures refer to similar structures.

DETAILED DESCRIPTION OF THE DRAWINGS

The present disclosure relates to that of copending, commonly owned and invented U.S. patent application Ser. No. 08/533,890, filed Sep. 26, 1995, entitled "High Speed Product Term Assignment . . . ", attorney docket no. M-3201, incorporated herein by reference.

Figure 1A:
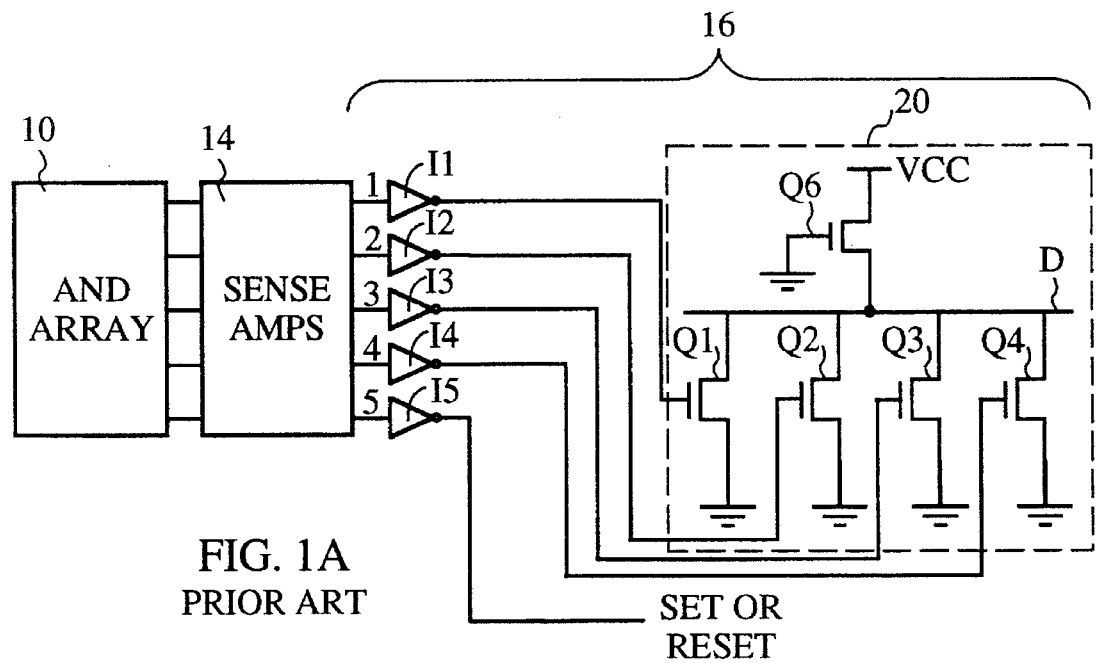
FIG. 1A shows a prior art structure including an AND array, sense amplifiers, and a portion of a macrocell.
Figure 1B:
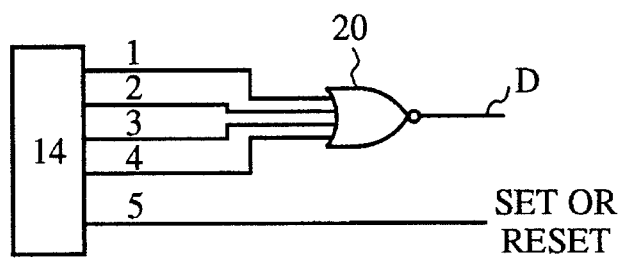
FIG. 1B shows the NOR gate of FIG. 1A at a gate level.
Figure 2:
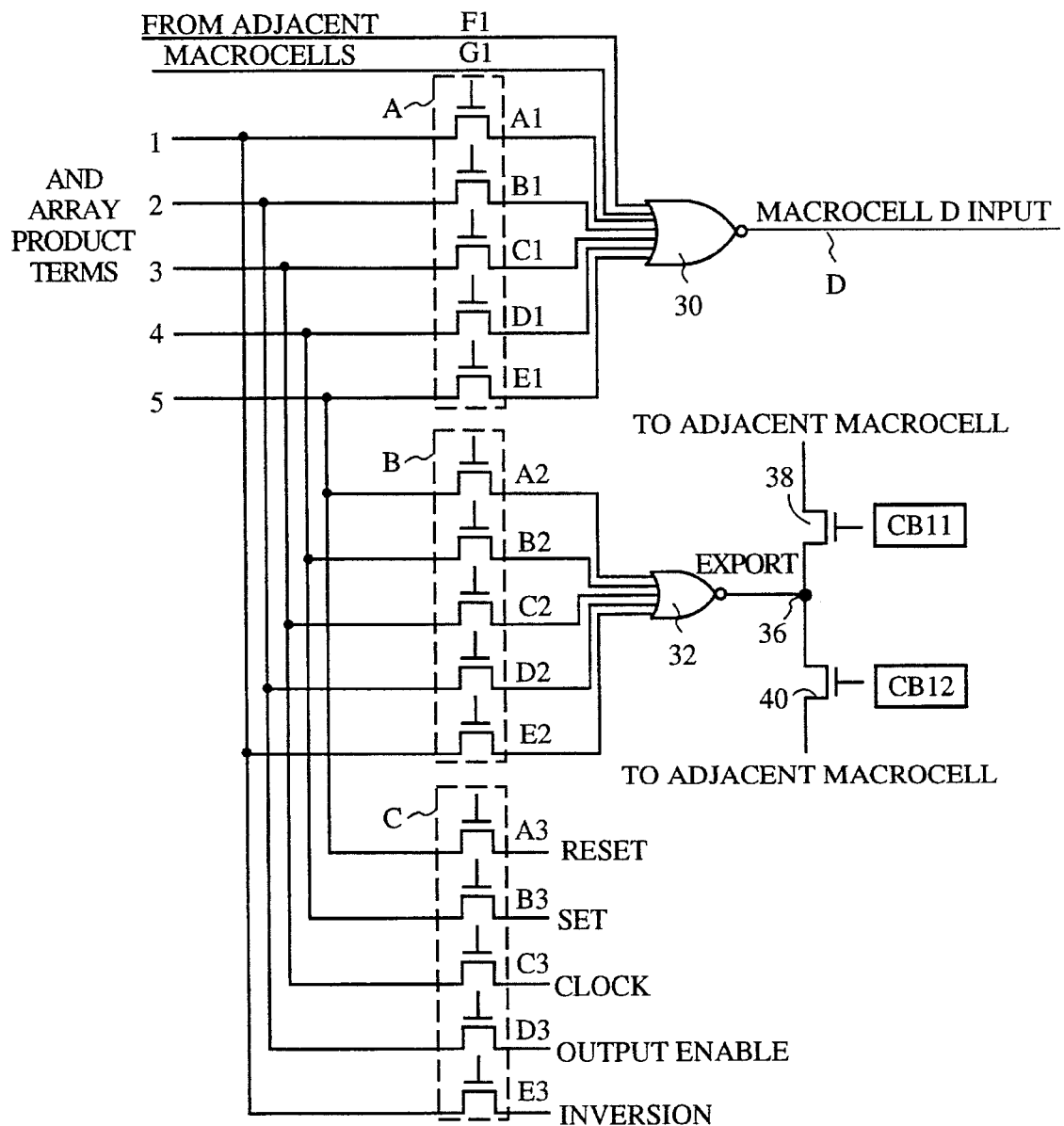
FIG. 2 shows a gate level circuit in accordance with the present invention.

A gate level circuit to be substituted in a macrocell for the prior art circuit of FIG. 1B is shown in FIG. 2. In FIG. 2, the AND array 10, sense amps 14, and inverters I1–I5 of FIG. 1A are not shown for simplicity but are understood as being present. Each of product terms 1–5, programmably provided on lines A1, B1, C1, D1, E1, and the signals on lines F1 and G1 (export signals from adjacent macrocells) are input signals to a first NOR gate 30. Note that in one embodiment, these programmable connections include n-type transistors in transistor group A. The output terminal of NOR gate 30 is connected via line D to the D input terminal of the flip-flop in the particular macrocell. The flip-flop itself and the remainder of the macrocell are not shown, but are conventional and are described, for instance, in the above-referenced Xilinx publication. Also, it is to be understood that use of a NOR gate is illustrative and other logic elements equivalent to a NOR gate may be substituted therefor.

The five product terms 1–5 are also programmably provided via transistor group B on lines A2, B2, C2, D2, E2 as the input signals to a second NOR gate 32, i.e. the "export" NOR gate. The output signal of NOR gate 32 is provided to node 36 which, depending on the states of transistors 38 and 40, is transferred (exported) to two adjacent macrocells. Transistors 38 and 40 are controlled by configuration bits CB11 and CB12, respectively (conventional configuration bits used in programmable logic arrays). The five product terms 1–5 are also programmably provided via transistor group C on lines A3, B3, C3, D3 and E3. In one embodiment, product terms 1–5 serve as reset, set, clock, output enable, and inversion signals, respectively, for the flip-flop of that macrocell.

Thus, as shown in FIG. 2, the five product terms 1–5 from the programmable AND array (not shown) are allocated to each macrocell. However, these five product terms are used in four different embodiments. Specifically, in one embodiment, all five product terms are provided to NOR gate 30 such that the five product terms plus two product terms from the adjacent macrocells (on lines F1 and G1) are NORed together (wherein each transistor of transistor group A is activated (explained in detail below)). In a second embodiment of the present invention, all five product terms are logically combined by NOR gate 32, wherein the resultant logical signal is exported to one or more adjacent macrocells for additional product term use (i.e. each transistor of transistor group B is activated). In the third embodiment, the five product terms are set as internal private control product terms used for reset, etc. (i.e. each transistor of transistor group C is activated). Thus, in the three above-described embodiments, product terms 1–5 are used in only one embodiment, i.e. as input signals to NOR gate 30, as input signals to export NOR gate 32, or as private (control) product terms. In a fourth embodiment, the product terms are provided to different destinations. For example, product term 1 is provided to NOR gate 31, product terms 2 and 5 are provided to NOR gate 32, and product terms 3 and 4 are provided as internal private control products terms.

Thus, in comparison to the prior art shown in FIGS. 1A and 1B which includes only four product terms used in only one embodiment, the present invention which includes the five product terms as well as the two product terms from the adjacent macrocells and uses the product terms in a plurality of embodiments significantly increases flexibility in functionality and potential computation complexity.

Figure 3:
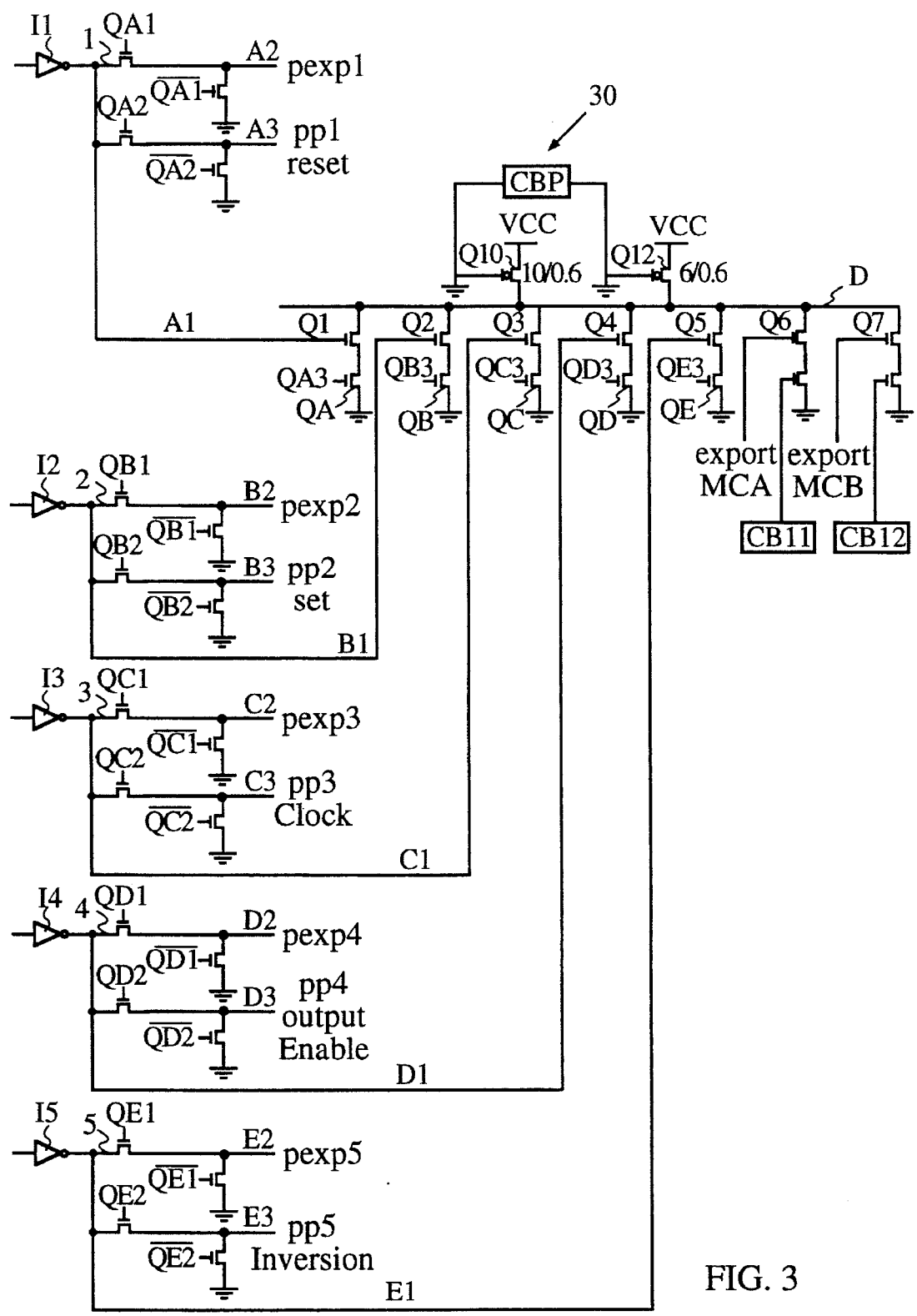
FIG. 3 shows a transistor level version of the circuit of FIG. 2.

FIG. 3 is a transistor level schematic diagram of a portion of the circuit of FIG. 2 (export NOR gate 32 and transistors 36 and 38 are not shown). It is to be understood that FIG. 3 shows only one implementation of the circuit of FIG. 2. In FIG. 3, the various lines A1, A2, A3, B1, B2, B3, ..., E1, E2, E3 correspond to the similarly labeled lines in FIG. 2. Note that conventional inverters I1–I5 (FIG. 1A) are shown in FIG. 3, but were not shown in FIG. 2 for simplicity.

Each product term from the AND array has three possible destinations, but the user can use or activate only one of the options for each product term. In one embodiment, each product term has two associated configuration bits (not shown) which are set by the user, and then decoded to designate the correct destination. Thus, for example, two configuration bits determine the values of each of control signals QA1, QA2, and QA3 (in one embodiment, bits (0,0) indicate product term 1 is provided only on line A1, bits (0,1) indicate product term 1 is provided only on line A2, and bits (1,0) indicate product term 1 is provided only on line A3). Thus, there is a total of 32 configuration bits (30 bits for the 5 product terms, and 2 bits for the above-described export configuration bits CB11, CB12).

Referring to FIG. 3 in further detail, the output signals on lines pexp1 (A2), pexp2 (B2), ..., pexp5 (E2) are the export product terms, wherein the nomenclature "pexp" refers to an export product term. The control signals QA1, QB1, QC1, QD1, and QE1 control their associated pass transistors which form transistor group B (FIG. 2). Note that if control signal QA1, for example, is low, thereby indicating that product term 1 will not be placed on line A2, then a logic zero signal is placed on line A2 due to signal QA1(bar).

The private product term signals in FIG. 3 are on lines pp1 (A3), pp2 (B3), pp3 (C3), pp4 (D3), and pp5 (E3), wherein the nomenclature "pp" refers to private product term. These lines provide the macrocell's flip-flop control signals, including reset, set, clock, output enable and inversion signals, as described previously in reference to FIG. 2. The private product terms on those lines are determined by the control signals QA2, QB2, QC2, QD2, and QE2 (and their respective inverses), i.e. to turn on the associated pass transistors if those product terms are to be provided to those lines, or to turn off one or more pass transistors if those product terms are provided on other paths. Similarly to the control signals for the export product terms, if control signal QD2, for example, is low, thereby indicating that product term 4 will not be placed on line D3, then a logic zero signal is placed on line D3 due to signal QD2(bar).

NOR gate 30 includes five transistors Q1–Q5 controlled respectively by product terms 1–5. In turn, transistors Q1–Q5 are connected in series to transistors QA–QE, respectively, wherein transistors QA–QE are controlled by control signals QA3, QB3, QC3, QD3 and QE3. Thus, transistors QA–QE provide the programable control for NOR gate 30, the output line of which is labeled D as in FIG. 2.

In one embodiment, the present invention includes a power control circuit. In FIG. 3, the power control circuit is implemented with two current drive PMOS transistors Q10 and Q12 (unlike one such transistor in FIG. 1A). The relative size in microns (length/width) of transistors Q10 and Q12 is shown in FIG. 3. Transistor Q10 is sized larger than transistor Q12, thereby providing greater drive current. A configuration bit set CBP determines which of transistors Q10, Q12 is on, wherein only one transistor Q10 or transistor Q12 is on at one time. Given the relative size of transistors Q10 and Q12, transistor Q10 provides approximately 100µ amps current for a supply voltage of 5 volts, while transistor Q12 provides a drive current of approximately 300 amps. Thus, a selective drive current is provided, wherein the higher drive current provides higher speed operation, and the lower drive current provides slightly lower speed performance while conserving power.

Figure 4:
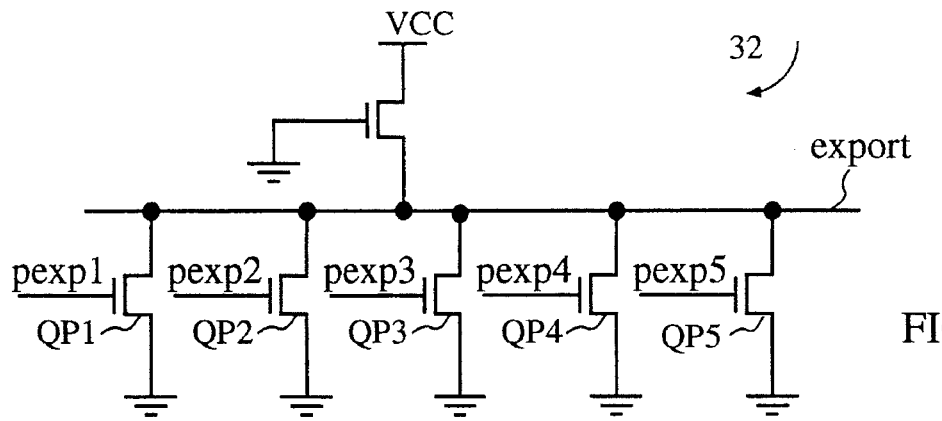
FIG. 4 shows the export NOR gate of FIG. 2 at the transistor level.

In FIG. 3, the decoding for NOR gate 30 (i.e. the configuration bits which determine the value of signals QA3, QB3 ... QE3) is incorporated into NOR gate 30 to speed up signal propagation. Alternatively, NOR gate 30 could be similar to export NOR gate 32 which includes five transistors QP1, QP2, ..., QP5 as shown in FIG. 4. NOR gate 32 is slower than NOR gate 30 because in NOR gate 32 the signal must pass through decoding devices (not shown) and then through the NOR gate itself. Thus, NOR gate 30 significantly decreases, i.e. halves, the signal delay in comparison to NOR gate 32.

Figure 5:
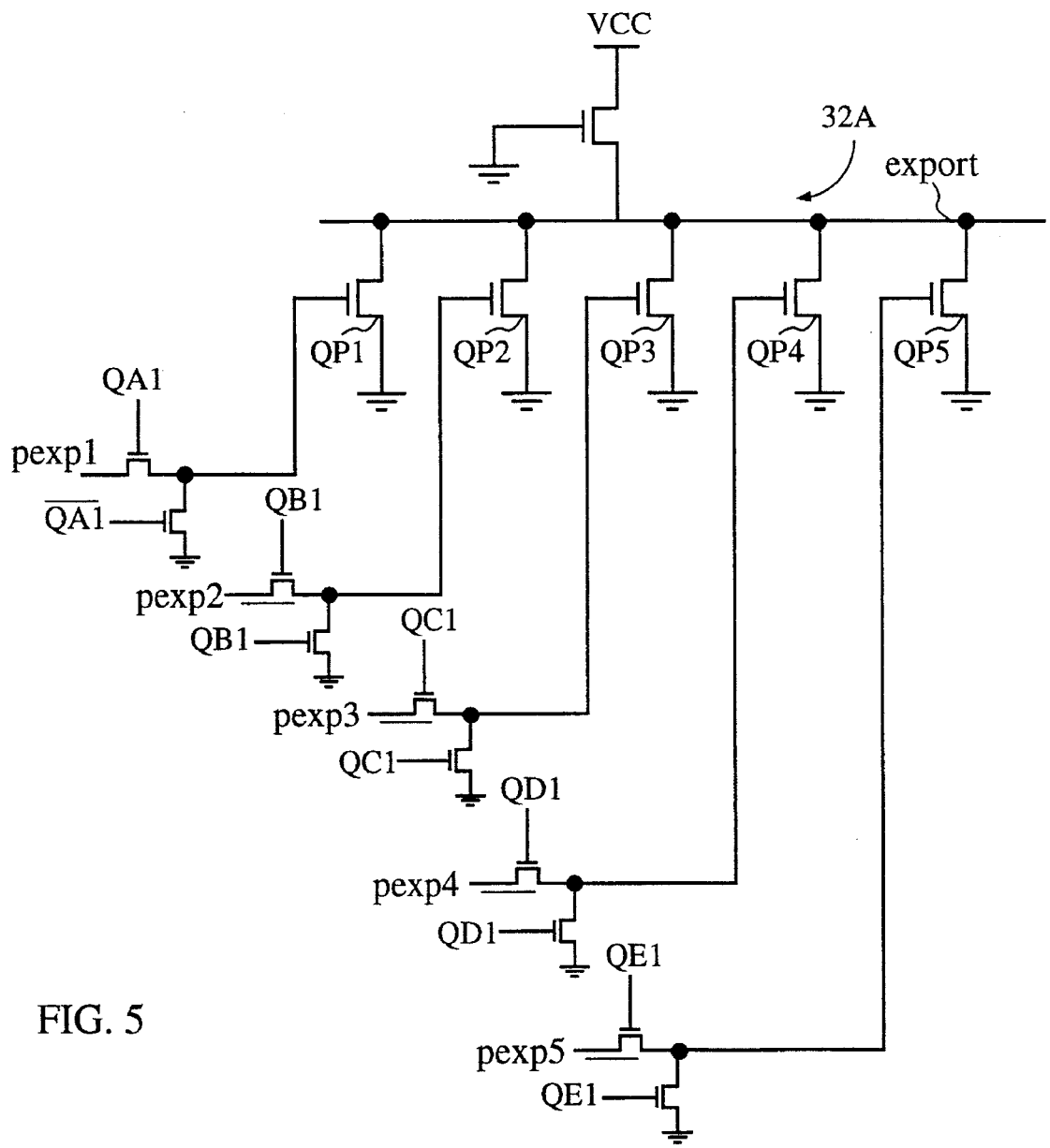
FIG. 5 shows an alternative version of the structure of FIG. 4.
Figure 6:
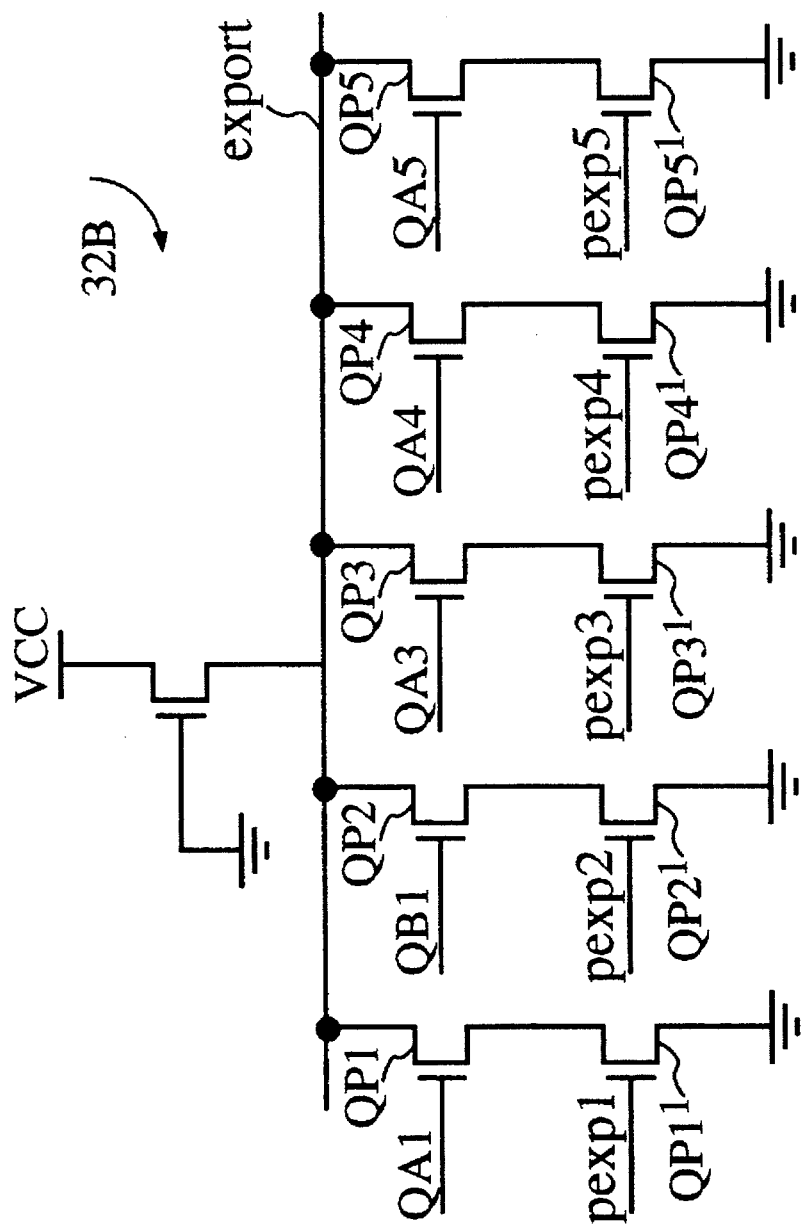
FIG. 6 shows an alternative faster structure to that of FIG. 5.

FIGS. 5 and 6 show alternative NOR gates 32A and 32B, with decoding included but otherwise having identical functioning to NOR gate 32 (except that NOR gate 32B switches faster than NOR gate 32A by approximately one nanosecond). Note that NOR gate 32B includes an extra set of control transistors QP1', ..., QP5'. Also, NOR gates 32A or 32B may be used (with the addition of inputs F1 and G1) to implement NOR gate 30 (FIG. 2).

As can be seen, for at least some signal paths, the present invention significantly increases function flexibility in comparison to the prior art shown in FIG. 1A. Specifically, the private product terms in the present invention are used internally for a particular macrocell instead of using global signals to provide these functions as provided in the prior art. In this manner, the present invention conserves at least one chip pin (terminal) and enhances flexibility because each macrocell has its own private control signals. Additionally, in one embodiment, each macrocell has one private term independent of the other macrocells, if the choice is made to use the private product term.

The above description is illustrative and not limiting. Further modifications will be apparent to one skilled in the art in light of this disclosure and are intended to fall within the scope of the appended claims.

We claim:

1. A circuit in a macrocell of a programmable logic device having an AND array providing a plurality of product terms, the macrocell having a flip-flop, the circuit comprising:

a plurality N of circuit input terminals, each receiving a product term from the AND array;

a first logic gate having at least N input terminals, each programably connected to one of the N circuit input terminals and the first logic gate having a output terminal connected to a data input terminal of the flip-flop; and a second logic gate having N input terminals, each programably connected to one of the N circuit terminals, and the second logic gate having an output terminal selectively connected to an adjacent macrocell;

wherein each of the N circuit input terminals is individually programably connectable as a product term in the macrocell.

2. The circuit of claim 1, wherein N is equal to five, and the circuit input terminals are respectively individually programably connectable as reset, set, clock, output enable, and inversion product terms.

3. The circuit of claim 1, wherein the first and second logic gates are each a NOR gate.

4. The circuit of claim 1, wherein the output terminal of the second logic gate is selectively connected to each of the two adjacent macrocells by a switch.

5. The circuit of claim 1, wherein the first logic gate includes:

a selector; and two drive transistors of different current driving capacities each having a control terminal connected to the selector, each of the drive transistors being connected to supply current to the logic gate, whereby the selector allows supply of current to the first logic gate by respectively one or another of the drive transistors in a high current mode or a low current mode.

6. The circuit of claim 1, wherein N is equal to five.

7. The circuit of claim 1, wherein the first logic gate has N+2 input terminals, two of the input terminals being connected to receive signals from adjacent macrocells of the programable logic device.

8. A method of operating a programable logic array including an AND array supplying a plurality of product terms to a macrocell having a flip-flop, comprising the steps of:

allocating N of the product terms to a first macrocell;

programably logically combining all N of the product terms;

supplying a signal representative of the logic combination to a data input terminal of the flip-flop;

separately programmably logically combining all N of the product terms, and providing a signal representative of the separate logic combination selectively to a second macrocell in the programable logic array; and individually programably setting each of the N product terms as a signal for use within the first macrocell.

* * * * *